United States Patent [19]
Ikrath

[11] 4,004,227
[45] Jan. 18, 1977

[54] RADIO FREQUENCY INTERFERENCE (RFI) TESTING BY THE DUAL SCREEN ROOM TECHNIQUE

[75] Inventor: Kurt Ikrath, Elberon, N.J.

[73] Assignee: The United States of America as represented by the Secretary of the Army, Washington, D.C.

[22] Filed: Oct. 3, 1975

[21] Appl. No.: 619,280

[52] U.S. Cl. .................................. 325/67; 343/703
[51] Int. Cl.² ...................................... G01R 31/02
[58] Field of Search ............... 324/58, 72, 95, 96; 325/67, 363; 343/17.7, 100 R, 100 AP, 703

[56] References Cited
UNITED STATES PATENTS

| | | | |
|---|---|---|---|
| 3,290,598 | 12/1966 | Thomas | 325/67 |
| 3,466,652 | 9/1969 | Heyser | 343/17.7 |

*Primary Examiner*—Benedict V. Safourek
*Attorney, Agent, or Firm*—Nathan Edelberg; Robert P. Gibson; Edward Goldberg

[57] ABSTRACT

The RFI generated by a piece of electrical or electronic equipment is measured by placing the equipment within a screened test room. A pick-up antenna within the room generates a signal which, after filtering and amplification, drives a reference antenna in a second screened room which is identical to the first. A second pick-up antenna in the first room and a corresponding antenna in the second room are connected to a comparator which compares the RF field intensity in both rooms.

11 Claims, 2 Drawing Figures

RADIO FREQUENCY INTERFERENCE (RFI) TESTING BY THE DUAL SCREEN ROOM TECHNIQUE

GOVERNMENT LICENSE

The invention described herein may be manufactured and used by or for the Government for governmental purposes without the payment of any royalties thereon or therefor.

BACKGROUND OF THE INVENTION a. Field of the Invention

Broadly speaking, this invention relates to the measurement of radio frequency interference. More particularly, in a preferred embodiment, this invention relates to methods and apparatus for accurately measuring the radio frequency interference generated by operating electrical or electronic apparatus and equipment.

b. Discussion of the Prior Art

As is well known, virtually all electrical and electronic equipment generates a certain amount of radio frequency interference (RFI) when operating. By careful design and the use of screening, the unwanted RFI can be minimized, but not completely eliminated. It thus becomes important to accurately measure the RFI generated by a particular piece of equipment to determine if it is compatible for use with other electronic equipment which may be sensitive to even low levels of RFI.

The specifications on permissible limits of spurious radiation from electrical and electronic equipment are typically stated in terms of spectral field intensities with reference to free space or half space conditions. However, in practice, the RFI pollution that exists in free space hinders the determination and measurement of spurious RF radiation from potential RFI sources and, thus, handicaps the enforcement of meaningful specifications and regulations on electromagnetic compatibility.

To overcome this problem, the so-called "screen room" was developed to provide both shielding from external RF interference and an environment in which standardized RFI test procedures could be developed for all types of RFI sources.

While the screen room has been highly successful in shielding the test apparatus from external interference it has not, unfortunately, led to the development of practical test procedures, particularly when the dimensions of the screen room and the wavelengths of the interference emitted from the test object become compatible. In other words, within the confinement of the screen room proximity effects, wall interaction, and mutual coupling between the test object and the measuring object tend to yield erroneous measurements.

The problem, then, is to devise a test environment and a testing procedure which are free from both the RFI interference in free space and perturbations caused by the test instruments themselves.

SUMMARY OF THE INVENTION

The above problem has been solved by the instant invention which, in a preferred embodiment, comprises a pair of substantially identical screen rooms each including at least two pick-up loop antennas disposed at corresponding locations within the rooms.

Means are provided in the first room for receiving the object under test and the second room includes a correspondingly positioned reference source antenna.

The apparatus further includes a filtering means connected to the first pick-up antenna in the first room, for filtering from its output all frequencies other than those of interest, and a variable gain r.f. amplifier connected between the output of the filtering means and the reference source antenna in the second room.

Lastly, the apparatus includes means, connected to the second pick-up loop antenna in each room, for comparing the r.f. field generated by the test object with that generated by the reference antenna.

The invention and its mode of operation will be more fully understood from the following detailed description, when taken with the drawings, in which:

DETAILED DESCRIPTION OF THE INVENTION

The invention disclosed and claimed herein is based on the discovery that two identical screen rooms, one housing the equipment under test and the other housing a portion of the test equipment, form an ideal environment conducting RFI measurements. As will more fully explained below, this dual screen room technique satisfies both the shielding requirements and the standard test procedure requirements, discussed above, and may be analogized to the technique in which the arms of a balanced bridge may be used to compare the resistance and reactance of known and unknown circuit elements or to the way in which a calibrated feedback circuit may be used to measure the gain of an amplifier by setting the gain of the feedback loop to unity.

Figure 1:
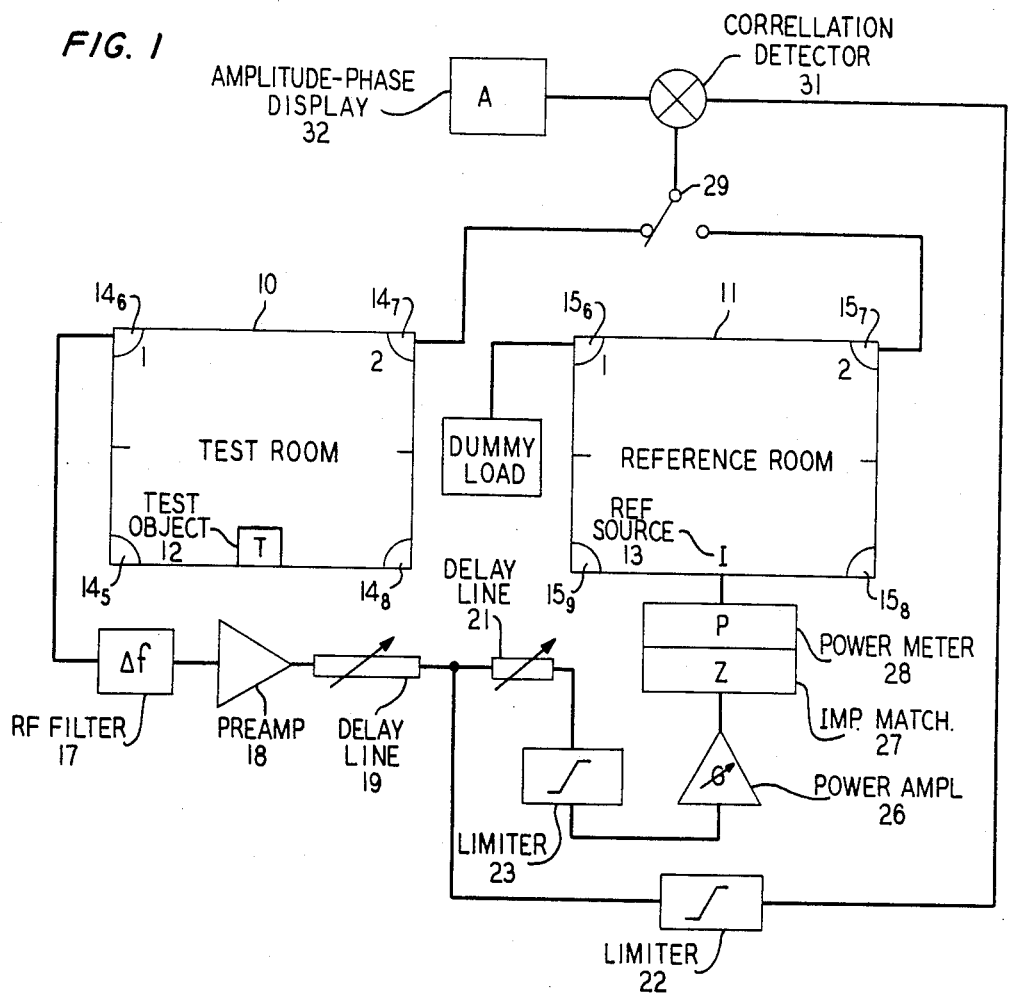
FIG. 1 is a block schematic drawing of an illustrative embodiment of the invention.

Turning now to FIG. 1, two identical screen rooms 10 and 11 are positioned in proximity to one another. Screen room 10, the test room, houses the object 12 which is to be tested while screen room 11, the reference room, houses a reference source 13 forming part of the test apparatus.

Figure 2:
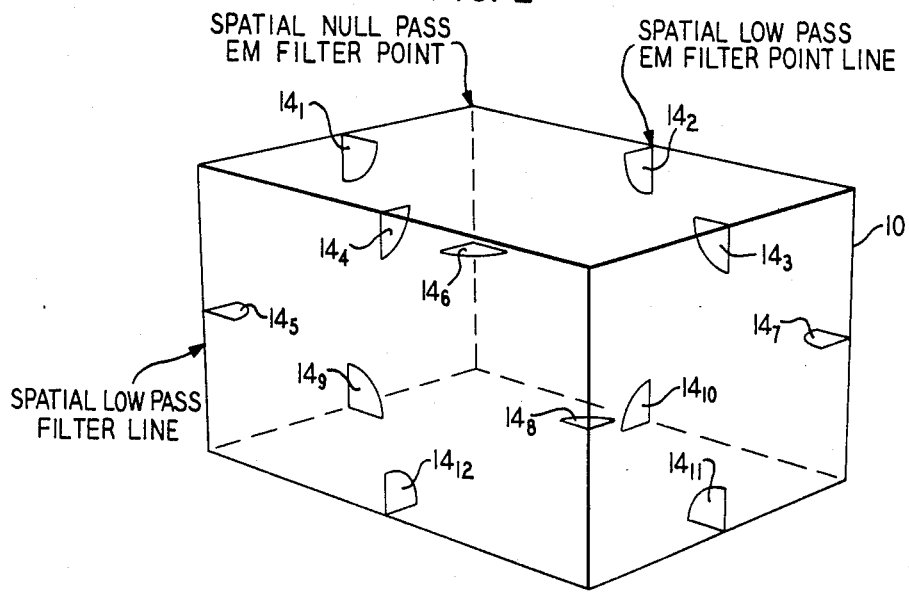
FIG. 2 is a diagrammatic, isometric view of a portion of the apparatus shown in FIG. 1.

As shown more clearly in FIG. 2, screen room 10 includes a plurality of quarter circle pick-up loops $14_1 - 14_{12}$ respectively positioned at the edges of each horizontal and vertical wall, equidistant from the corners of the room. RF power emanating from test object 12 will energize the test room cavity and induce RF voltages in each of the pick-up loops $14_1 - 14_{12}$.

The location of the pick-up loops is, of course, a function of the boundary conditions for the electromagnetic fields in the screen room. For example, in the corners of the room the boundary conditions dictate that the EM fields must vanish because of the mutually perpendicular relationship of the three conductive walls of the corner. Hence, the corners act as spatial null-pass filter points for the excited EM field.

Next in the spatial hierarchy of boundary conditions are the edges formed by the horizontal and vertical wall joints. These act as spatial low-pass filter lines for the EM fields. The center points on the edge lines, i.e., the points that are equidistant from the room corners, correspond to the widest spatial low-pass filter points. That is, the spatial low-pass filter which is least sensitive to the geometric asymmetries of the field. Hence, with the pick-up loops placed at the spatial low-pass filter points in the screen room, the zero order moments of the spatial field energy distribution may be sensed in a manner which is analogous to the way in which a low-pass filter may be used to sense the DC components of a time-varying current wave which is described by a Fourier series in the frequency domain.

Reference room 11 is, of course, identical to test room 10 and thus includes a corresponding plurality of pick-up loops $15_1$–$15_{12}$, only four of which are shown in FIG. 1.

In the illustrative embodiment, pick-up loop $14_6$ is employed as the source of RF energy from the test room. The output of loop $14_6$ is connected to an RF filter 17, which filters the desired frequency $o$ from the loop output, thence to a pre-amplifier 18 and an adjustable delay line 19.

The output of delay line 19 is fed to a second delay line 21 and to a limiter circuit 22. The output of the delay line 21 is fed to a second limiter 23, thence to an RF power amplifier 26. The output of power amplifier 26 is connected, via an impedance matching device 27 and a power meter 28, to the reference source antenna 13 within reference room 11.

Pick-up loop $14_7$ in room 10 and pick-up loop $15_7$ in room 11 are connected, via a single-pole, double throw switch 29, to the input of a correlation detector 31. The other input to correlation detector 31 is from limiter 22. The output from correlation detector 31 is connected to an amplitude-versus-phase display unit 32. To maintain symmetry, pick-up loop $15_6$ in room 11 is connected to a dummy load which has an impedance equal to that seen by loop $14_6$ in room 10; that is, the input impedance of RF filter 17 and pre-amplifier 18.

In operation, switch 29 is thrown to connect pick-up loop $14_7$ to correlator 31 and the amplitude of the field in room 10 measured by display device 32. Delay line 19 is then adjusted to make the relative phase zero. Next, the switch 29 is thrown to connect loop $15_7$ to correlator 31 and the gain of power amplifier 26 adjusted until display device 32 reads the same amplitude as it did for room 10. At the same time delay line 21 is adjusted to bring the relative phase to zero.

It will be apparent that under the circumstances described above, the RF field created in reference room 11 by reference source 13 is substantially identical to the field created in test room 10 by test object 12 at the frequency of interest. In other words, the easily measured power being fed into the reference RFI source equals the power emitted in the selected frequency band from the test object under identical conditions.

Any asymmetry that may exist in the field produced by the test object may be checked by repeating the above procedure with other spatial filter point pick-up loops. The worst case, that is, the loop yielding the maximum RF input into the reference room is used to define the equivalent RFI electrical and magnetic dipole moment of the test object at the selected frequency.

So far we have not discussed the exact nature of reference source antenna 13. In its simplest form, reference source 13 may be an electrical dipole and magnetic dipole (shielded loop) having dimensions which are compatible with the size of the test object and the frequency range of the test. When a large number of identical objects are to be tested, for example, on a "mass production" basis, the reference antenna can be a previously checked object itself.

One skilled in the art can make various changes and substitutions to the layout of parts shown without departing from the spirit and scope of the invention.

What I claim is:

1. A method of measuring the intensity of the radio frequency interference generated over a given frequency band by a test object, comprising the steps of:
   energizing said test object within the confines of a screened test room, thereby to induce an r.f. field in said room;
   sampling, at a first location in said room, the intensity of said r.f. field;
   filtering from said sampled r.f. field all frequencies other than those falling within said given band;
   amplifying said filtered r.f. field in an r.f. amplifier;
   energizing with the output of said amplifier a reference source antenna positioned within the confines of a screened reference room, said screened reference room being substantially identical to said screened test room, thereby to induce an r.f. field in said reference room;
   sampling, at a second location in said test room, the intensity of the r.f. field induced therein by said test object;
   sampling, at a corresponding location in said reference room, the intensity of the r.f. field induced therein by said reference source antenna;
   comparing the two samples above taken; and then
   adjusting the gain of said amplifier until the results of the comparison indicate that the r.f. field induced in the test room by said test object equals the r.f. field induced in the reference room by said reference source antenna whereby the power output of said amplifier yields an accurate measure of the radio-frequency interference generated by said test object.

2. The method according to claim 1 including the further steps of equalizing the electrical path lengths yielding the r.f. field samples from said test and said reference rooms.

3. The method according to claim 1 including the further step of positioning said test object and said reference source at corresponding positions within said test and reference rooms.

4. The method according to claim 1 wherein the sampling steps in said test and reference rooms occur at locations in said rooms on the spatial low-pass filter lines therein formed by the edges of the walls of said rooms.

5. Apparatus for measuring the intensity of the radio frequency interference generated over a given frequency band by a test object, which comprises:
   first and second substantially identical screen rooms each having pick-up means disposed at corresponding locations therein;
   means in said first room for receiving said test object;
   a reference source antenna in said second room positioned to correspond to the receiving means in said first room;
   means connected to said pick-up means at a first location in said first room for filtering out all but the frequencies falling within said frequency band;
   a variable gain r.f. amplifier having its input connected to said filtering means and its output connected to said reference source antenna to energize the same; and
   means connected to said pick-up means at a second location in said first screen room and a corresponding location in said second screen room for comparing the r.f. field generated by said test object with the r.f. field generated by said reference antenna.

6. The apparatus according to claim 5 wherein said pick-up means includes first and second loop antennas at respective first and second locations in said rooms;
- a pre-amplifier and a first adjustable delay line interposed between the first loop antenna of said first room and said comparing means; and
- a dummy load connected to the first loop antenna of said second room, said dummy load simulating the input impedance seen looking into said filtering means and said pre-amplifier.

7. The apparatus according to claim 6 wherein said first and second pick-up loop antennas in each room are positioned on the spatial low-pass filter lines formed by the edges of said room.

8. The apparatus according to claim 7 wherein $n$ such pick-up loop antennas are provided in each room, $n \leq 12$, and the apparatus further includes means for selectively connecting said comparing means to corresponding pairs of said loop antennas.

9. The apparatus according to claim 6 further including
- a second adjustable delay line interposed between said first delay line and the input to said r.f. amplifier; and
- a power measuring device and impedance matching device interposed between said reference source antenna and the output of said r.f. amplifier.

10. The apparatus according to claim 6 wherein said comparing means comprises:
- a correlation detector;
- means connected to an input of said correlation detector for selectively switching said detector between the second loop pick-up antennas of said first and second rooms; and
- an amplitude-phase display device connected to the output of said correlation detector.

11. The apparatus according to claim 6 wherein said reference source antenna itself comprises a test object.

* * * * *